United States Patent
Nakanishi

(10) Patent No.: US 7,091,521 B2
(45) Date of Patent: Aug. 15, 2006

(54) DISPLAY DEVICE HAVING A PLURALITY OF LEADS CONNECTED TO A SINGLE COMMON LINE

(75) Inventor: Futoshi Nakanishi, Kanagawa (JP)

(73) Assignee: NEC LCD Technologies, Ltd., (JP)

( * ) Notice: Subject to any disclaimer, the term of this patent is extended or adjusted under 35 U.S.C. 154(b) by 0 days.

(21) Appl. No.: 10/964,434

(22) Filed: Oct. 13, 2004

(65) Prior Publication Data

US 2005/0083472 A1    Apr. 21, 2005

(30) Foreign Application Priority Data

Oct. 17, 2003    (JP)    .............................. 2003-358144

(51) Int. Cl.
*H01L 29/04*    (2006.01)
(52) U.S. Cl. .............................. 257/72; 257/59; 257/88
(58) Field of Classification Search ..................... None
See application file for complete search history.

(56) References Cited

U.S. PATENT DOCUMENTS 6,535,261 B1 *    3/2003    Anno et al. .................. 349/147

FOREIGN PATENT DOCUMENTS

JP    2003-098543    4/2003

* cited by examiner

*Primary Examiner*—Nathan J. Flynn
*Assistant Examiner*—Scott R. Wilson
(74) *Attorney, Agent, or Firm*—Hayes Soloway P.C.

(57) ABSTRACT

An LCD device includes a common line such as power source line in addition to data lines and scanning lines in the display area. The common line is connected to a plurality of peripheral leads in the peripheral area, the peripheral leads including first-type leads and second-type leads. The first-type lead is made of an ITO film for achieving a long-term reliability whereas the second-type lead has a two-layer structure including a metallic film and an ITO film for achieving a lower line resistance.

8 Claims, 6 Drawing Sheets

DISPLAY DEVICE HAVING A PLURALITY OF LEADS CONNECTED TO A SINGLE COMMON LINE

BACKGROUND OF THE INVENTION (a) Field of the Invention

The present invention relates to a display device having a plurality of leads connected to a single common line, and more particularly, to a display device having a display area and a peripheral area, wherein drive ICs for driving signal lines and power supply lines disposed in the display area are coupled to the leads in the peripheral area.

(b) Description of the Related Art

The LCD device generally includes a pair of glass substrates opposing each other to sandwich therebetween a liquid crystal (LC) layer, the LC layer being applied with drive voltages for representing thereon desired images. FIG. 7 shows a sectional view of a typical LCD device connected to drive ICs (not shown) mounted on tape carrier packages (TCPs). The LCD device 200 includes first and second substrates 201 and 202 sandwiching therebetween an LC layer 205, wherein the first substrate 201 is larger than the second substrate 202. For example, the first substrate 201 mounts thereon active elements, power source lines, data lines and scanning lines, whereas the second substrate 202 mounts thereon color filters. The TCPs 203 mounting thereon drive ICs are coupled to the first substrate 201 via terminals (peripheral terminals) 204 disposed in the peripheral area 206, at which the first substrate 201 protrudes from the second substrate 202. The second substrate 202 opposes the display area 207 of the first substrate 201.

FIGS. 8A and 8B show details of alternative configurations in the vicinity of the peripheral terminals 204 in the peripheral area 206 shown in FIG. 7. The leads of data lines, scanning lines and power supply lines extending in the display area 207 of the first substrate 201 are configured by ITO (indium-tin oxide) lines 211 shown in FIG. 8A or metallic lines 214 shown in FIG. 8B, and extend from the display area 207 to the peripheral area 206.

These ITO lines 211 or metallic lines 214 are protected by an insulating film 212 and exposed from openings of the insulating film 212, at which ITO pads 213 are formed for connecting the ITO lines 211 or metallic lines 214 to the TCPs 203. The ITO pads 213 are connected to electrodes 210 of the TCPs 203 via anisotropic conductive film wherein conductive particles are dispersed in a resin, and are covered by a resin film (not shown). A portion of the peripheral area 206 receiving therein the peripheral terminals 204 including the ITO pads 213 is referred to as a driver mounting area 208.

In the structure shown in FIG. 8A, since the ITO line 211 has a higher line resistance compared to the metallic line 214 shown in FIG. 8B, there is the problem of a lower speed operation of the display device having the ITO line 211. On the other hand, in the structure shown in FIG. 8B, the metallic line 214 is susceptible to erosion caused by ingress of water or disconnection caused by electro-migration. In short, there is a trade-off between the structures shown in FIGS. 8A and 8B as to a lower line resistance for achieving a higher operational speed and a higher erosion resistance for achieving a higher long-term reliability of the display device.

Patent Publication JP-A-2003-98543 describes a technique for solving the above trade-off by using the structure shown in FIG. 9, which shows the vicinity of the peripheral terminals 204 similarly to FIGS. 8A and 8B. The drive IC in the publication is mounted on the first substrate by using a COG (chip on glass) technique, wherein each lead is configured by a first-layer line 221 made of tantalum, a second-layer line 222 made of chrome and a third-layer line 223 made of ITO. Although the second-layer line 222 made of chrome has a lower erosion resistance compared to the tantalum and ITO, the second-layer line 222 has a lower electric resistance and provided only in the driver mounting area 208. The second-layer line 222 reduces the line resistance of the display device while being protected against the erosion due to the structure sandwiched between the first-layer line 211 and the third-layer line 213.

It is noted in the structure of the LCD device that the peripheral terminals include one or more common terminal sets in addition to data terminals and scanning terminals connected to data lines and scanning lines corresponding to respective rows and columns. The common terminal set includes a plurality of common terminals connected in common in the display area 207 and generally connected to all the rows or columns, and thus is requested to have a lower electric resistance and a higher current capacity. In this respect, a plurality of common lines connected in common in the display area 207 are generally connected via respective leads to respective common terminals of a common terminal set, and connected to the drive IC via respective leads.

FIG. 10 schematically shows an example of the typical LCD device. The LCD device includes a LCD panel configured by the substrates 201 and 202 and defining a plurality of pixels 209 therein, two TCPs each configuring a Y-driver 203 for driving scanning lines of the pixels 209, and three TCPs each configuring an X-driver 203 for driving data lines of the pixels 209. In the exemplified configuration, each Y-driver or each X-driver 203 is connected to a pair of common line sets 215 each including three leads connected in common in the display area 207.

The peripheral area 206 of the LCD device 200 shown in FIG. 10 can be implemented by the structure shown in FIG. 9 having a three-layer lead. However, if the LCD device operates for a long term, the structure shown in FIG. 9 is also susceptible to erosion of the second-layer line 222 due to the ingress of a small amount of water through the driver mounting area 208. Thus, the structure shown in FIG. 9 may eventually have a larger line resistance in the common leads, to degrade the image quality or cause a malfunction in the image display. This problem is common to another type of display device using a drive IC directly connected to the substrate.

SUMMARY OF THE INVENTION

In view of the above problems of the conventional technique, it is an object of the present invention to provide a display device having an excellent image quality after a relatively long-term operation of the display device.

The present invention provides a display device including: a display area receiving therein an array of pixels and a plurality of lines extending in row and column directions of the array, the plurality of lines including a common line; and a peripheral area receiving therein a plurality of leads connected in common to the common line, the plurality of leads including a first-type lead including a first material having a first resistivity and a first erosion resistance, and a second-type lead including a second material having a second resistivity lower than the first resistivity and a second erosion resistance lower than the first erosion resistance.

In accordance with the present invention, the first-type lead including the first material having a higher erosion resistance achieves a long-term reliability of the LCD device whereas the second-type lead including the second material having a lower resistivity achieves a lower line resistance of the leads and thus a higher operational speed of the LCD device.

The above and other objects, features and advantages of the present invention will be more apparent from the following description, referring to the accompanying drawings.

PREFERRED EMBODIMENT OF THE INVENTION

Figure 1:
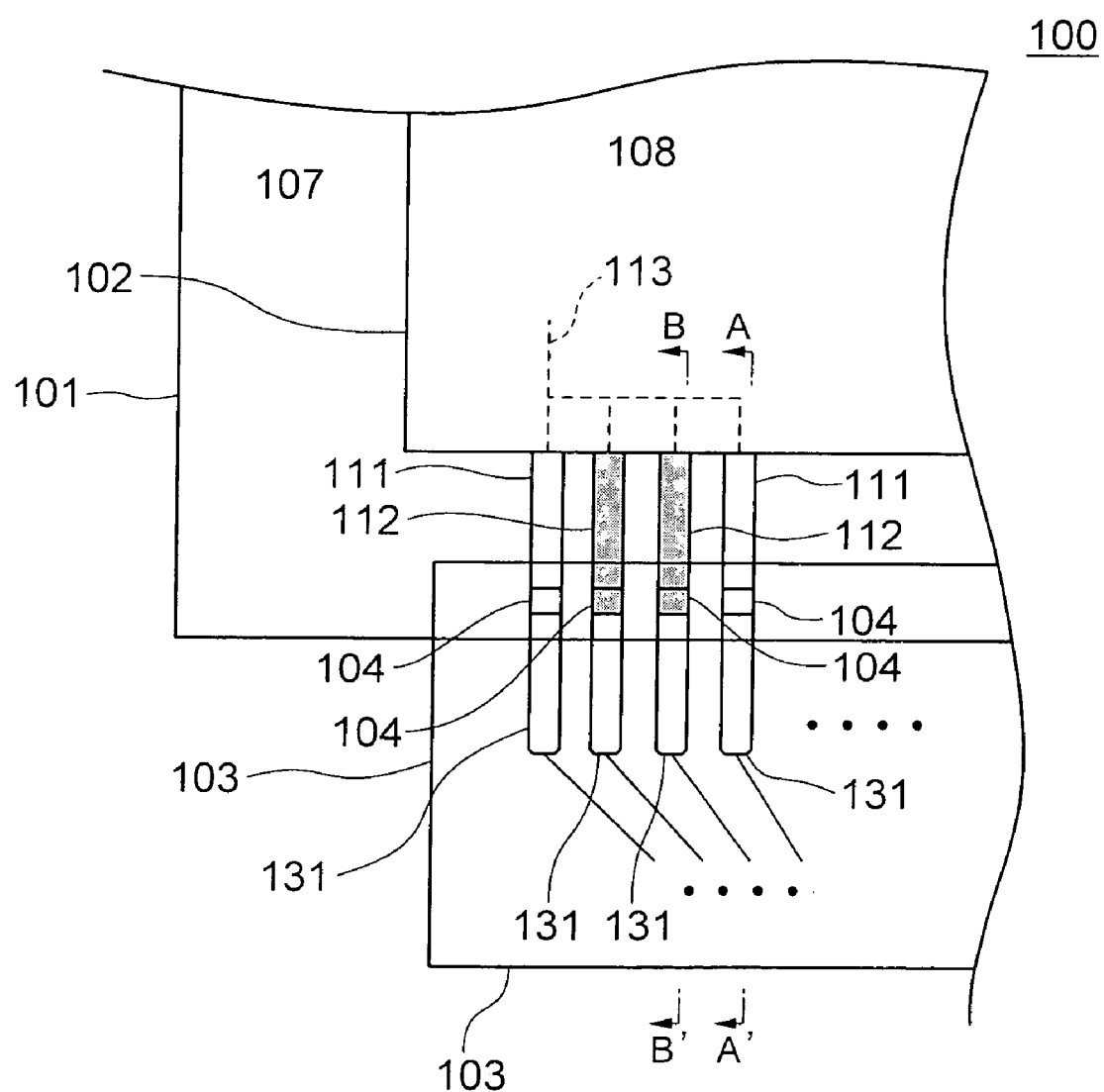
FIG. 1 is a partial top plan view of a display device according to a first embodiment of the present invention.

Now, the present invention is more specifically described with reference to accompanying drawings, wherein similar constituent elements are designated by similar reference numerals.

Figure 10:
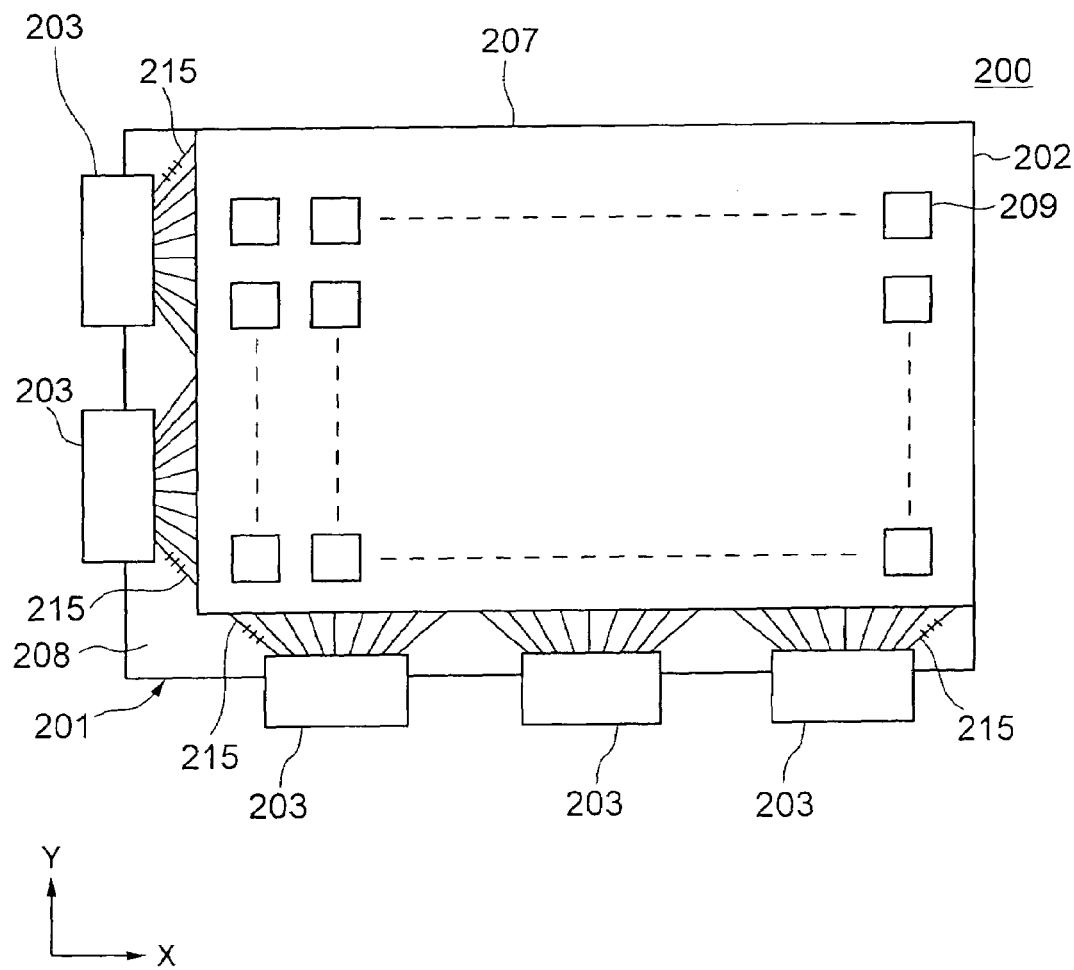
FIG. 10 is a top plan view of the typical LCD device.

Referring to FIG. 1, a display device 100, configured as an LCD device, according to a first embodiment of the present invention includes a first substrate 101 defining a display area 108 and a peripheral area 107, a second substrate 102 opposing the first substrate 101 at the display area 108 thereof, and a plurality of TCPs 103 each connected to the first substrate 101 in the peripheral area 107. In the exemplified configuration, a single common line 113, such as a power source line or ground line, in the display area 108 is connected to the drive IC via four common leads including two first-type leads 111 and two second-type leads 112, as well as four electrodes 131 disposed in the TCP 103. The structure of the display area 108 is similar to that described with reference to FIG. 10

Figure 2A:
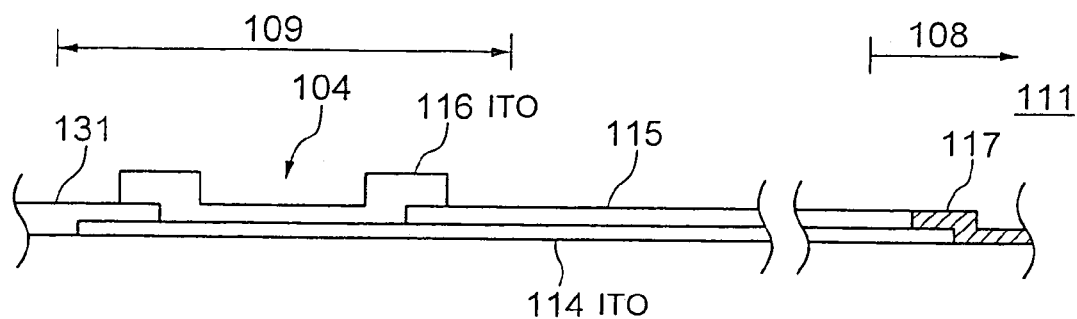
FIG. 2A is sectional view of a lead in the display device of FIG. 1, taken along line A–A' in FIG. 1.

Referring to FIG. 2A, the first-type lead 111 includes an ITO line 114 covered with an insulating film 115 and extending from the periphery of the display area 108 toward the driver mounting area 109. The proximal end of the ITO line 114 is connected to a metallic line 117, which extends in the display area 108, whereas the distal end of the ITO line 114 is connected to an ITO pad 116 through an opening of the insulating film 115 in the driver mounting area 109.

Figure 2B:
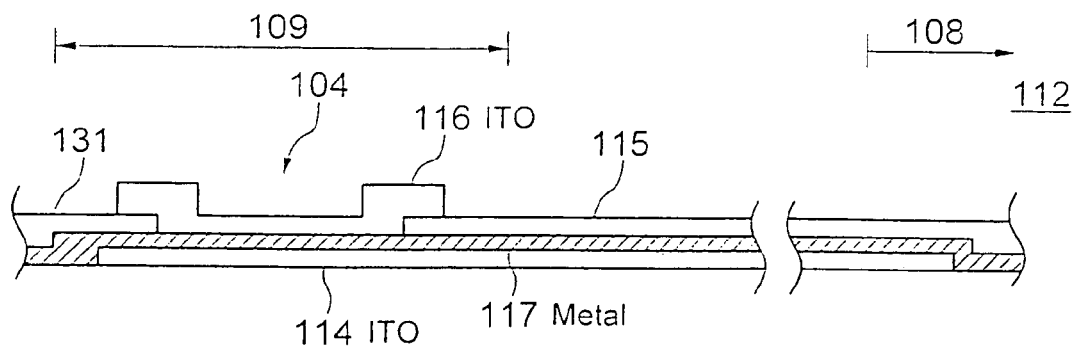
FIG. 2B is a sectional view of another lead in the display device of FIG. 1, taken along line B–B' in FIG. 1.

Referring to FIG. 2B, the second-type lead 112 includes an ITO line 114 and a metallic line 117 formed as a two-layer lead covered with the insulating film 115 and extending from the periphery of the display area 108 toward the driver mounting area 109. An ITO pad 116 is disposed in contact with the metallic line 117 through an opening of the insulating film 115. The metallic line 117 extends in the display area 108 as a single-layer line. The metallic line 117 is made of aluminum or molybdenum, for example.

Figure 3:
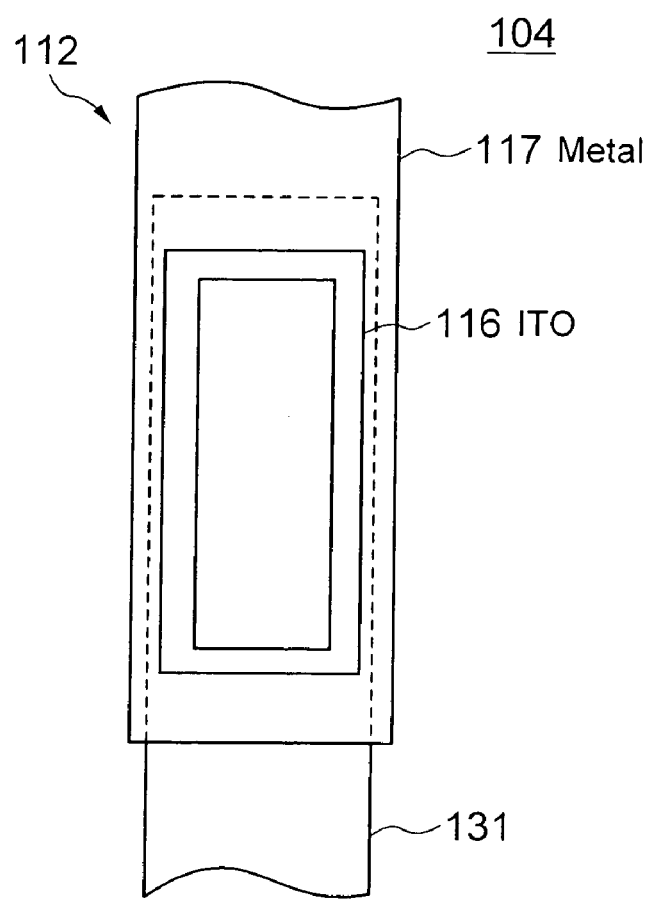
FIG. 3 is an enlarged top plan view of the vicinity of the peripheral terminal shown in FIG. 1.

Referring to FIG. 3 showing a top plan view of the peripheral terminal 104 connected to the second-type lead 112, the ITO pad 116 has a shape of rectangular dish having a depression in the central area thereof. The ITO pad 116 is coupled to the metallic line 117 and to an electrode 131 of the TCP 103 by using an anisotropic conductive resin film wherein conductive particles are dispersed in a resin. The driver mounting area 109 receiving therein the peripheral terminals 104 is covered with an insulating resin film (not shown).

In the above configuration, the plurality of leads 111 and 112 are connected to the respective electrodes 131 of the TCP 103, and also connected to the single common line 113 in the display area 108. The first-type lead 111 has a higher erosion resistance and a higher electric resistance compared to the second-type lead 112. On the other hand, the second-type lead 112 has a lower electric resistance and a lower erosion resistance compared to the first-type lead 111.

The configuration of the two first-type leads 111 and the two second-type leads 112 connected in common allows a higher erosion resistance as well as a lower overall line resistance. This structure achieves a lower line resistance compared to the structure wherein all the leads are configured by the structure shown in FIG. 8A, and also achieves a higher reliability compared to the structure wherein all the leads are configured by the structure shown in FIG. 8B.

Figure 4:
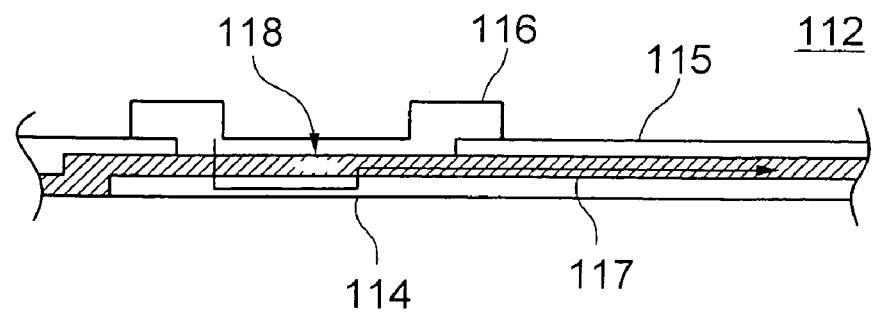
FIG. 4 is a partial sectional view of the lead of FIG. 2B after being involved with a disconnection.

According to the LCD device 100 of the present embodiment, the second-type lead 112 provides an excellent image quality due to the lower line resistance thereof at least in the initial stage of the lifetime of the LCD device 100. After the long-term operation of the LCD device 100, the second-type lead 112 may be subjected to erosion due to the ingress of water or occurring of electro-migration to raise the line resistance thereof. In such a case, the first-type lead 111 achieves a higher reliability due to the consistent line resistance thereof before and after the long-term operation of the LCD device. In the structure of the second-type lead 112, even if a disconnection 118 shown in FIG. 4 occurs in the metallic film 117 right under the ITO pad 116, a current will flow through the ITO line 114 along the arrow shown in FIG. 4, thereby suppressing a rise in the line resistance.

It is noted in the present invention that a long-term operation of the LCD device 100 may damage the metallic line 117 of the second-type lead 112 due to the erosion or electro-migration of the metallic line to cause a disconnection therein. In such a case, the first-type lead 111 remains as it is without involving a disconnection, thereby providing a consistent line resistance. By designing the number of the first-type leads 111 at a suitable number for achieving a tolerable image quality even if a specified number or all of the second-type leads 112 are damaged by disconnection, the image quality of the LCD device can be secured at an acceptable level.

Figure 5:
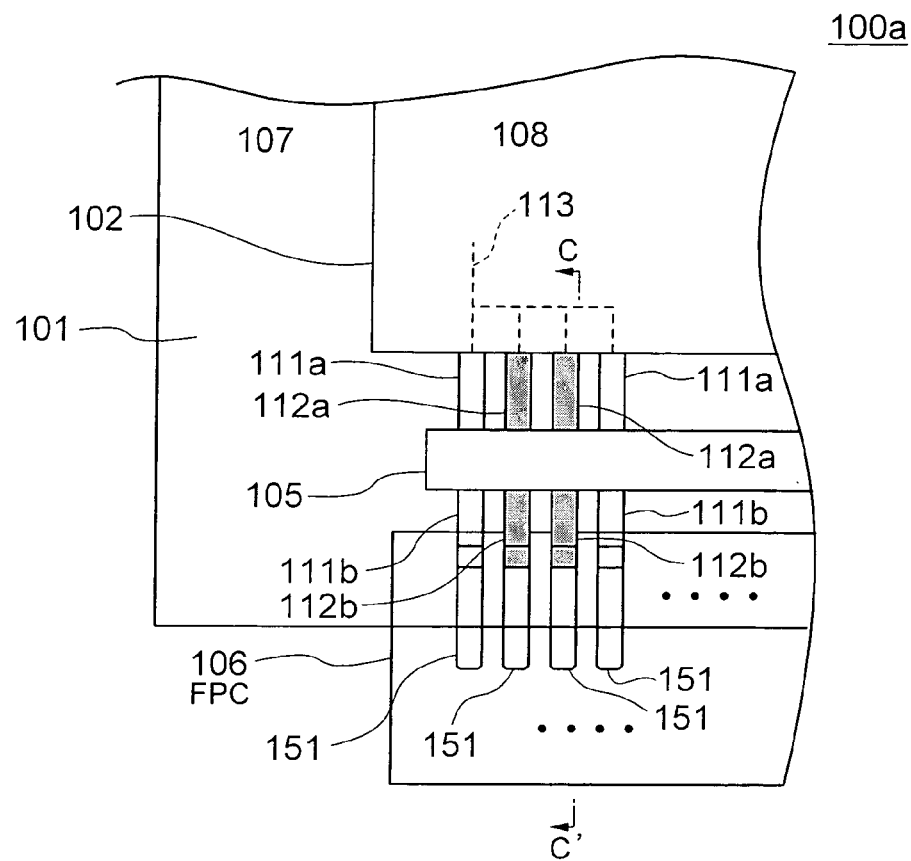
FIG. 5 is a partial top plan view of a display device according to a second embodiment of the present invention.

Referring to FIG. 5, an LCD device according to a second embodiment of the present invention is such that a drive IC 105 is mounted on the first substrate 201 by using a COG technique and that electrodes of a flexible printed circuit (FPC) 106 are connected to the leads of the first substrate 101 via the drive IC 105. In the exemplified configuration, the common line 113 in the display area 108 is connected to the FPC 106 via a plurality of first-type leads 111a and a plurality of second-type leads 112a, which connect the common line 113 to the drive IC 105, and via a plurality of first-type leads 111b and a plurality of second-type leads 112b, which connect the drive IC 105 to the FPC 106.

Figure 6:
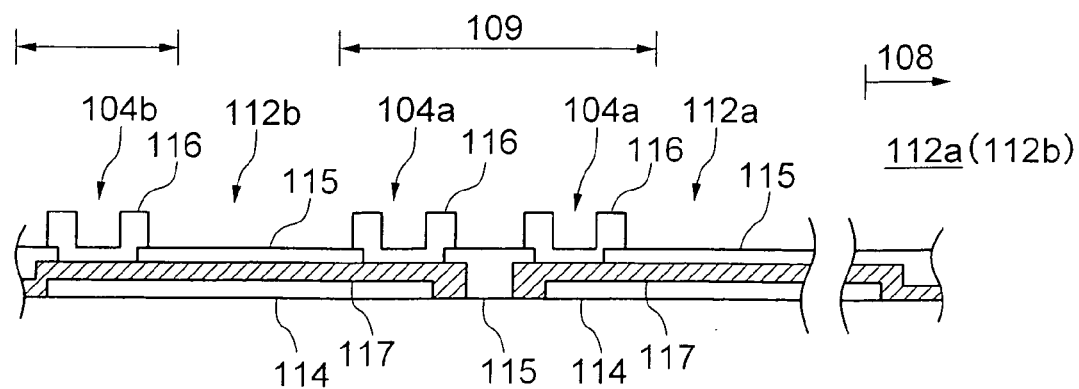
FIG. 6 is a sectional view of a lead shown in FIG. 5, taken along line C–C' in FIG. 5.
Figure 7:
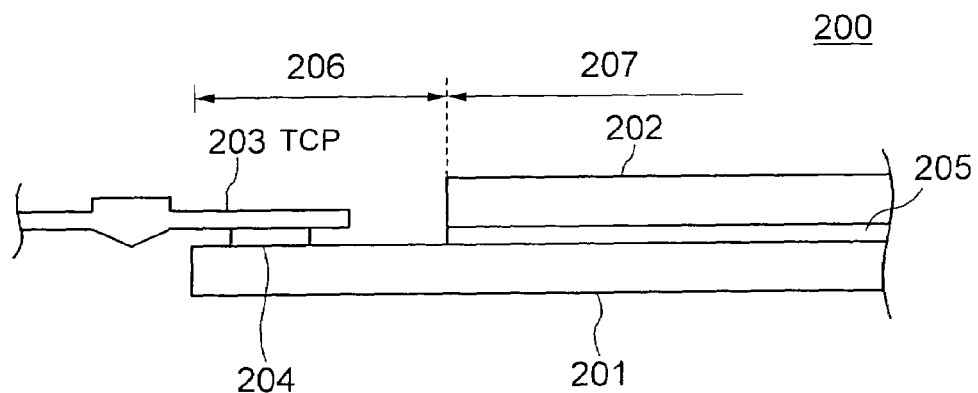
FIG. 7 is a sectional view of a vicinity of a lead in a typical LCD device.

Referring to FIG. 6 showing the second-type lead 112a or 112b, peripheral terminals 104a in the driver mounting area 109 and a peripheral terminal 104b in a FPC mounting area connect the common line 113 to the FPC 106. In other words, the second-type lead 112 is divided into two sections 112a and 112b by the peripheral terminals 104a in the driver mounting area 109. The function of the common leads in the second embodiment is similar to that of the common leads in the first embodiment.

Figure 8A:
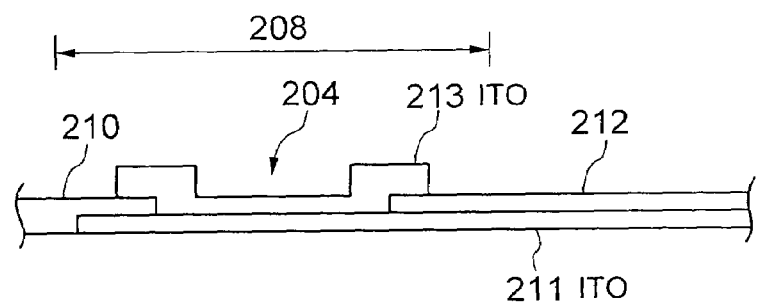
FIG. 8A is a detailed sectional view of the lead of FIG. 7.
Figure 8B:
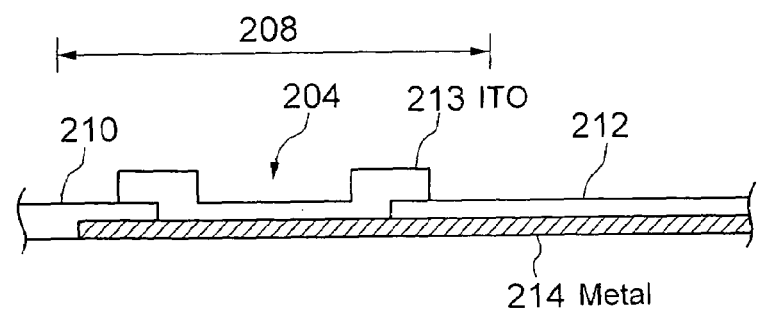
FIG. 8B is a detailed sectional view of an alternative of the lead of FIG. 8A.
Figure 9:
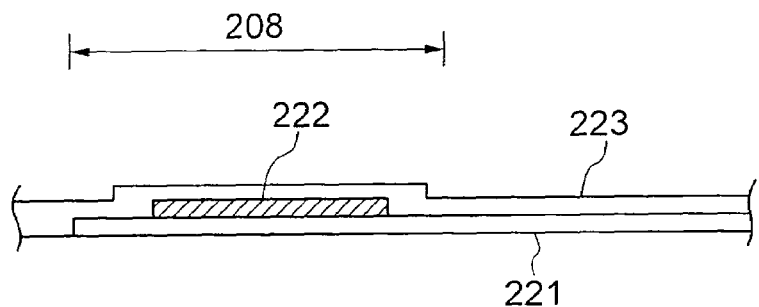
FIG. 9 is a detailed sectional view of a lead in another LCD device described in a patent publication.

It is to be noted that the first-type lead 111 in FIG. 1 may be replaced by the structure shown in FIG. 8A, whereas the second-type lead 112 may be replaced by the structure shown in FIG. 8B. In such a case, the structure shown in FIG. 8A achieves a higher erosion resistance whereas the structure shown in FIG. 8B achieves a lower line resistance. Thus, the LCD device 100 of the modified embodiment has a higher image quality in the initial stage of operation and also has a higher reliability after a long-term operation of the LCD device. In the structure shown in FIG. 2B, the ITO line 114 and the metallic line 117 may be reversed in the arrangement thereof, wherein the ITO line 114 overlies the metallic line 117.

Since the above embodiments are described only for examples, the present invention is not limited to the above embodiments and various modifications or alterations can be easily made therefrom by those skilled in the art without departing from the scope of the present invention.

What is claimed is:

1. A display device comprising:
   a display area receiving therein an array of pixels and a plurality of electric lines extending in row and column directions of said array, said plurality of electric lines including a common line; and
   a peripheral area receiving therein a plurality of leads connected in common to said common line,
   said plurality of leads including a first-type lead formed of a first material having a first resistivity and a first erosion resistance, and a second-type lead formed of said first material and a second material having a second resistivity lower than said first resistivity and a second erosion resistance lower than said first erosion resistance.

2. The display device according to claim 1, wherein said common line is connected to a plurality of rows or columns of said pixels.

3. The display device according to claim 1, wherein said first material is indium-tin oxide (ITO) and said second material is a metal or alloy.

4. The display device according to claim 3, wherein said second-type lead includes a plurality of layers of said metal or alloy.

5. The display device according to claim 3, wherein said second-type lead includes said first material underlying or overlying said second material.

6. The display device according to claim 3, wherein said second material is molybdenum or aluminum.

7. The display device according to claim 1, wherein said peripheral area receives therein a plurality of pads each including said first material.

8. The display device according to claim 1, wherein said display device is a liquid crystal display device.

* * * * *